US011219150B2

(12) United States Patent
Suzuki

(10) Patent No.: US 11,219,150 B2
(45) Date of Patent: Jan. 4, 2022

(54) WORK MACHINE AND METHOD FOR DETERMINING POLARITY

(71) Applicant: FUJI CORPORATION, Chiryu (JP)

(72) Inventor: Hiromi Suzuki, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/772,993

(22) PCT Filed: Jan. 10, 2018

(86) PCT No.: PCT/JP2018/000323
§ 371 (c)(1),
(2) Date: Jun. 15, 2020

(87) PCT Pub. No.: WO2019/138469
PCT Pub. Date: Jul. 18, 2019

(65) Prior Publication Data
US 2020/0396877 A1 Dec. 17, 2020

(51) Int. Cl.
*G01R 31/28* (2006.01)
*H05K 13/08* (2006.01)
(Continued)

(52) U.S. Cl.
CPC ......... *H05K 13/08* (2013.01); *G01R 31/2813* (2013.01); *G01R 31/70* (2020.01); *H05K 13/003* (2013.01)

(58) Field of Classification Search
CPC ........ H05K 3/341; H05K 13/08; H05K 13/04; H05K 13/003; H05K 13/0812;
(Continued)

(56) References Cited

U.S. PATENT DOCUMENTS 4,223,786 A 9/1980 Hori
4,635,293 A * 1/1987 Watanabe ............... G06T 5/006
382/130
(Continued)

FOREIGN PATENT DOCUMENTS

CN 103945681 A 7/2014
JP 54-96764 A 7/1979
(Continued)

OTHER PUBLICATIONS

International Search Report dated Mar. 13, 2018 in PCT/JP2018/000323 filed Jan. 10, 2018, citing documents AA and AO-AT therein, 2 pages.

*Primary Examiner* — Vinh P Nguyen
(74) *Attorney, Agent, or Firm* — Oblon, McClelland, Maier & Neustadt, L.L.P.

(57) ABSTRACT

A work machine includes a control device including a lead position detecting section to detect a lead position which is positions of a pair of leads based on imaged data imaged by an imaging device, a first detecting region setting section to set, based on the lead position detected by the lead position detecting section, a first detecting region outside the pair of leads including a part of a bottom section outside the pair of leads, a second detecting region outside the pair of leads, being opposed to the first detecting section across the pair of leads including a part of the bottom section, and a polarity determining section configured to determine the polarity of the pair of leads based on whether the mark portion exists in each of the first detecting region and the second detecting region.

8 Claims, 9 Drawing Sheets

(51) Int. Cl.
*G01R 31/70* (2020.01)
*H05K 13/00* (2006.01)

(58) Field of Classification Search
CPC ............ H05K 13/0473; H05K 13/046; H05K 13/0069; H05K 13/0813; H05K 13/0404; G06T 2207/30164; G06T 7/001; G06T 7/74; G01R 31/70; G01R 31/2813; G01B 11/00; G01B 11/02; G01B 11/002; G01B 11/24; G01B 11/26
See application file for complete search history.

(56) References Cited

U.S. PATENT DOCUMENTS

| | | | | |
|---|---|---|---|---|
| 4,972,311 | A * | 11/1990 | Holdgrafer | H01L 21/682 348/95 |
| 6,061,467 | A * | 5/2000 | Michael | G06T 7/001 257/E21.53 |
| 6,229,608 | B1 * | 5/2001 | Morris | H05K 13/0813 356/623 |
| 6,738,504 | B1 * | 5/2004 | Higashi | H01L 21/67259 257/E21.528 |
| 10,297,039 | B2 * | 5/2019 | Tanaka | H05K 13/0813 |
| 10,746,535 | B2 * | 8/2020 | Iwasaki | G01N 21/95 |
| 2008/0204764 | A1 * | 8/2008 | Kimura | G01B 11/2433 356/601 |

FOREIGN PATENT DOCUMENTS

| | | |
|---|---|---|
| JP | 2-251714 A | 10/1990 |
| JP | 8-237000 A | 9/1996 |
| JP | 10-150298 A | 6/1998 |
| JP | 2007-273519 A | 10/2007 |
| WO | WO 2014/038087 A1 | 3/2014 |

* cited by examiner

|  | FIRST DETECTING REGION | SECOND DETECTING REGION | DETERMINATION RESULTS |
|---|---|---|---|
| CASE 1 | BRIGHT | DARK | NORMAL |
| CASE 2 | DARK | BRIGHT | REVERSE POLARITY |
| CASE 3 | DARK | DARK | ABNORMAL |
| CASE 4 | BRIGHT | BRIGHT | ABNORMAL |

WORK MACHINE AND METHOD FOR DETERMINING POLARITY

TECHNICAL FIELD

The present disclosure relates to a work machine configured to determine a polarity of a lead component having a pair of leads and a method for determining polarity.

BACKGROUND ART

Conventionally, there has been an electronic component mounting device configured to detect the position of a center of an electronic component picked up and held to a suction nozzle based on imaged data of the electronic component (Patent Literature 1 and the like). An electronic component mounting device described in Patent Literature 1 sets a first window inscribed in a pair of electronic components and a second window circumscribed on the pair of electrode sections. The electronic component mounting device detects the position of the center of the electronic component based on luminance brightness inside the first window and the second window.

PATENT LITERATURE

Patent Literature 1: JP-A-2007-273519 (FIG. 5)

BRIEF SUMMARY

Technical Problem

Incidentally, for example, a lead component having a pair of leads has the polarity of the leads. Such a lead component needs to be supplied or mounted on a circuit board or the like with the polarity arranged properly. Additionally, in this type of lead component, a mark portion is provided to indicate the polarity of the leads. For this reason, a technique has been desired, which can determine the polarity of a lead component based on such a mark portion.

The present disclosure has been made in view of the problem described above, and an object thereof is to provide a work machine configured to determine the polarity of a pair of leads of a lead component based on a mark portion and a method for determining the polarity.

Solution to Problem

With a view to solving the problem described above, according to the present description, there is disclosed a work machine including a head section configured to hold and move a lead component with having a main body section, a pair of leads provided at a bottom of the main body section, and a mark portion indicating a polarity of the pair of leads; an imaging device configured to image the bottom of the lead component held by the head section; and a control device, wherein the control device comprises: a lead position detecting section configured to detect, based on imaged data imaged by the imaging device, a lead position which is positions of the pair of leads; a first detecting region setting section configured to set, based on the lead position detected by the lead position detecting section, a first detecting region constituting a region outside the pair of leads with including a part of the bottom; a second detecting region setting section configured to set a second detecting region constituting a region outside the pair of leads, being opposed to the first detecting section across the pair of leads, with including a part of the bottom section; and a polarity determining section configured to determine the polarity of the pair of leads based on whether the mark portion exists in each of the first detecting region and the second detecting region.

Additionally, with a view to solving the problem described above, according to the present description, there is disclosed a method for determining polarity for a work machine including a head section configured to hold and move a lead component with having a main body section, a pair of leads provided at a bottom of the main body section, and a mark portion indicating polarity of the pair of leads, and an imaging device configured to image the bottom of the lead component held by the head section; the method for determining polarity being configured to determine the polarity of the pair of leads, the method comprising; a lead position detecting step of detecting, based on imaged data imaged by the imaging device, a lead position which is positions of the pair of leads; a first detecting region setting step of setting, based on the lead position detected by the lead position detecting step, a first detecting region constituting a region outside the pair of leads with including a part of the bottom section; a second detecting region setting step of setting a second detecting region constituting a region outside the pair of leads, being opposed to the first detecting section across the pair of leads with including a portion of the bottom section outside the pair of leads; and a polarity determining step of determining the polarity of the pair of leads based on whether the mark portion exists in each of the first detecting region and the second detecting region.

Advantageous Effects

According to the present disclosure, whether the mark portion exists in the two detecting regions of the first and second detection regions disposed opposite to each other across the pair of leads is determined. As a result, the polarity of the pair of leads of the lead component can be determined based on the mark portion.

DESCRIPTION OF EMBODIMENT

Configuration of Component Mounting Machine

Figure 1:
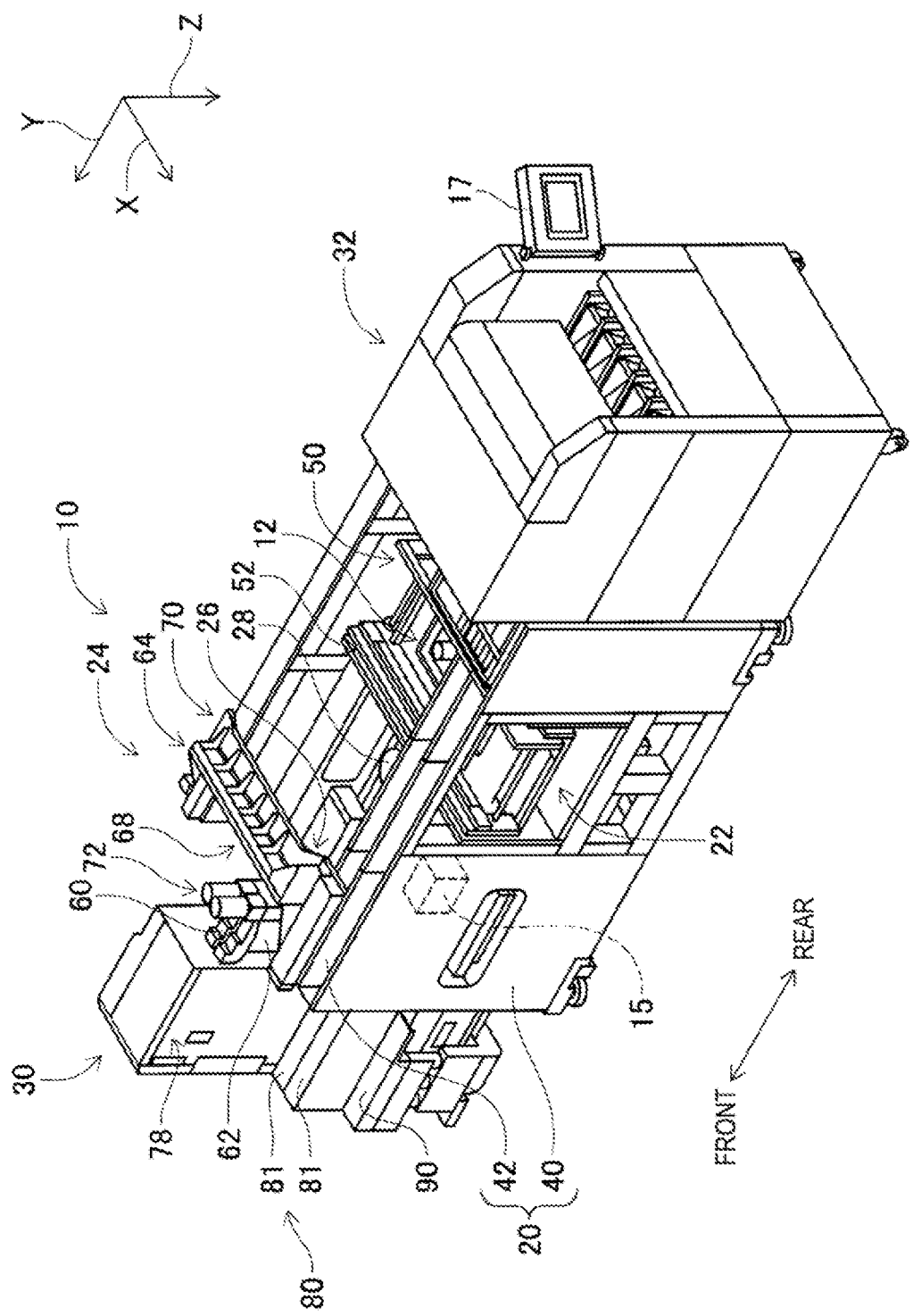
FIG. 1 is a perspective view showing a component mounting machine.

Hereinafter, an embodiment for carrying out the present disclosure will be described in detail by reference to drawings. FIG. 1 shows component mounting machine 10. Component mounting machine 10 is a device for executing mounting work of mounting components on circuit substrate 12. Component mounting machine 10 includes system main body 20, substrate conveyance and holding device 22, component mounting device 24, mark camera 26, part camera 28, component supply device 30, bulk component supply device 32, and control device 34 (refer to FIG. 3). A circuit board, a three-dimensionally structured substrate, and the like may be enumerated as circuit substrate 12, and a printed wiring board, a printed circuit board, and the like may be enumerated as the circuit board.

System main body 20 is comprised of frame section 40 and beam section 42 mounted on frame section 40. Substrate conveyance and holding device 22 is disposed at a longitudinal center of frame section 40 and has conveyance device 50 and clamping device 52. Conveyance device 50 is a device for conveying circuit substrate 12. Clamping device 52 is a device for holding circuit substrate 12. Being configured as described above, substrate conveyance and holding device 22 conveys circuit substrate 12 and fixedly holds circuit substrate 12 in a predetermined position. In the following description, a conveyance direction of circuit substrate 12 will be referred to as an X direction, a horizontal direction at right angles to the X direction will be referred to as a Y direction, and a vertical direction will be referred to as a Z direction. That is, a width direction of component mounting machine 10 constitutes the X direction, and a longitudinal or front-rear direction of component mounting machine 10 constitutes the Y direction.

Figure 2:
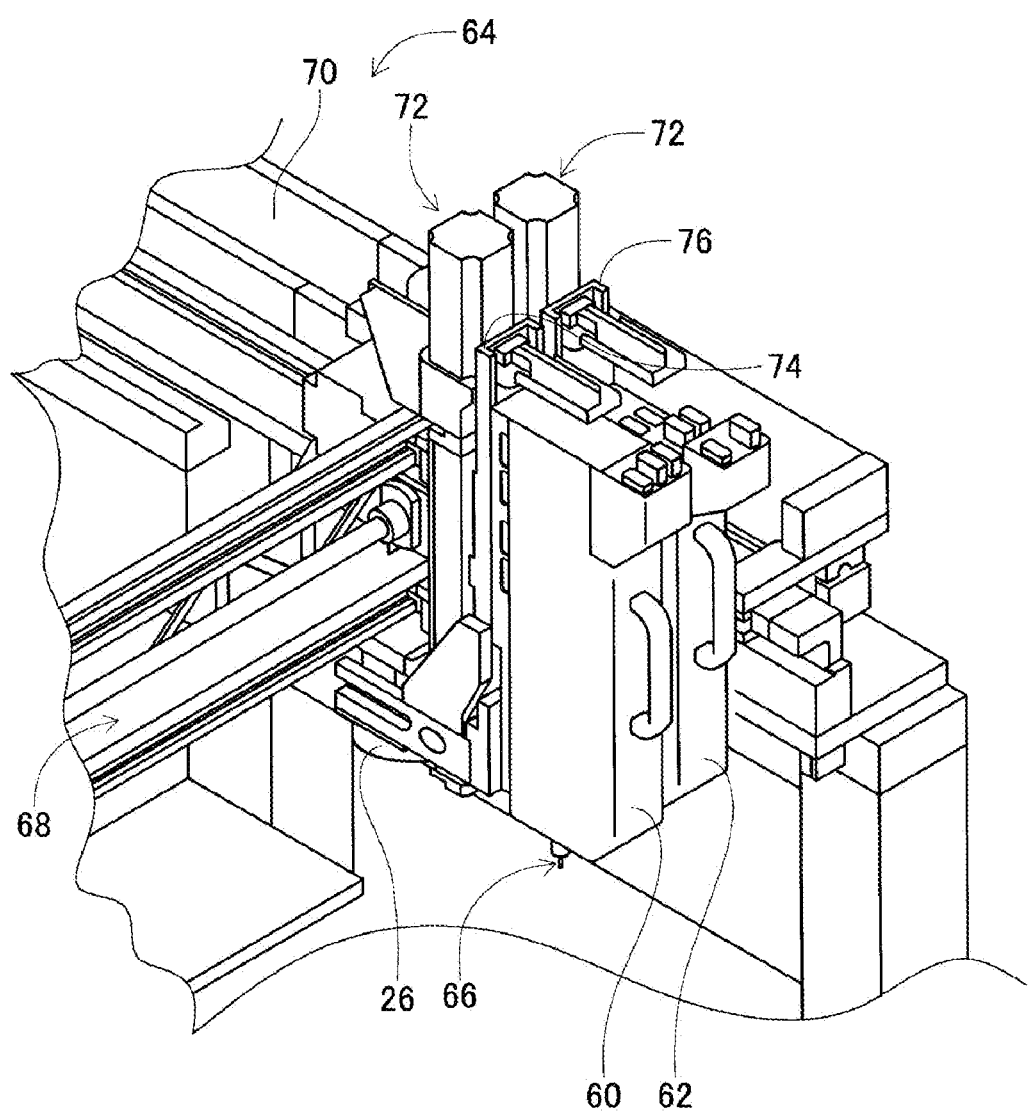
FIG. 2 is a perspective view showing a component mounting device of the component mounting machine.

Component mounting device 24 is disposed on beam section 42 and has two work heads 60, 62 and work head moving device 64. As shown in FIG. 2, suction nozzles 66 are provided individually on respective lower end faces of work heads 60, 62, and components are picked up and held by suction nozzles 66. Work head moving device 64 has X-direction moving device 68, Y-direction moving device 70, and Z-direction moving devices 72. Then, two work heads 60, 62 are moved together to an arbitrary position on frame section 40 by X-direction moving device 68 and Y-direction moving device 70. Work heads 60, 62 are detachably mounted on sliders 74, 76, respectively. Z-direction moving devices 72 move corresponding sliders 74, 76 in an up-down direction. That is, work heads 60, 62 are moved individually in the up-down direction by corresponding Z-direction moving devices 72.

Mark camera 26 is attached to slider 74 while being directed downwards and is moved in the X direction, the Y direction, and the Z direction together with work head 60. Thus, mark camera 26 images an arbitrary position on frame section 40. As shown in FIG. 1, part camera 28 is disposed between substrate conveyance and holding device 22 and component supply device 30 on frame section 40 while being direction upwards. As a result, part camera 28 images components gripped by suction nozzles 66 of work heads 60, 62.

Component supply device 30 is disposed at a longitudinal front end portion of frame section 40. Component supply 30 includes tray-type component supply device 78 and feeder-type component supply device 80. Tray-type component supply device 78 is a device for supplying components rested on a tray.

Figure 4:
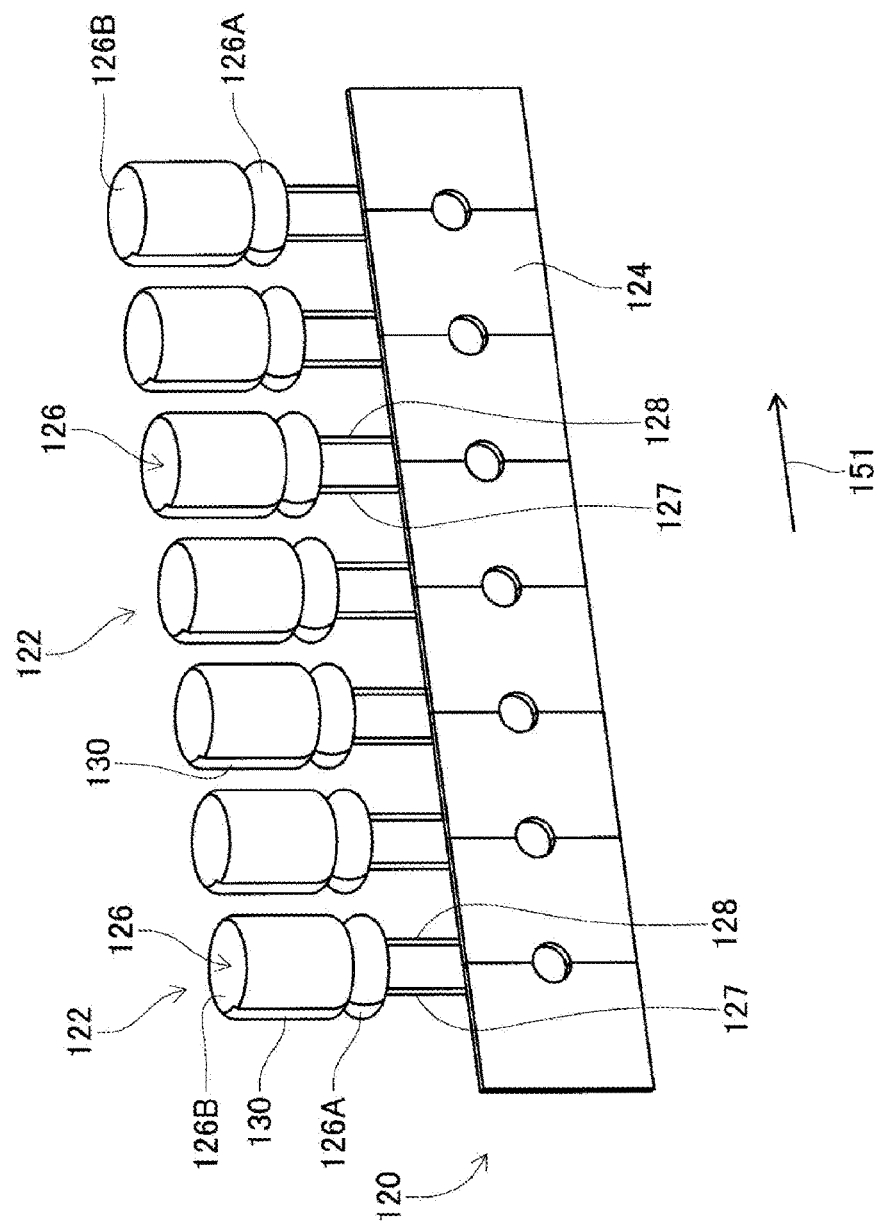
FIG. 4 is a perspective view showing a tape component with lead components fastened thereto.

Feeder-type component supply device 80 is a device for supplying components using tape feeders 81 or stick feeders (not shown). Tape feeders 81 are detachably mounted on tape feeder holding table 90 fixedly provided at the front end portion of frame section 40. Tape feeder 81 is a device configured to remove lead components 122 from taped for removing the lead part 122 from tape component 120 (see FIG. 4) to supply removed lead components 122. Lead component 122 is, for example, a radial component. As shown in FIG. 4, tape component 120 has multiple lead components 122 and carrier tape 124. Lead component 122 has a generally cylindrical main body section 126 and two leads 127, 128. Two leads 127, 128 each have a thin rod-like shape and extend downwards from bottom section 126A, which constitutes one end portion in the Z-direction, of main body section 126 in parallel to an axial direction of main body section 126. Then, two leads 127, 128 are taped to carrier tape 124 at distal end portions thereof, that is, end portions opposite to main body section 126.

Additionally, mark portion 130 is written on a side surface of main body section 126 of each of lead components 122. Mark portion 130 constitutes a mark for identifying the polarity of two leads 127, 128. For example, mark portion 130 indicates that the lead situated near mark portion 130 has a negative polarity. In the case shown in the figure, lead 127 situated below mark portion 130 has is cathode, while lead 128, which is different from lead 127, is anode. Mark portion 130 is marked on the side surface of main body section 126 of lead component 122 in such a manner as to extend in the up-down direction. An upper end portion of mark portion 130 extends to reach an upper surface 126B of main body section 126. Additionally, a lower end portion of mark portion 130 extends to reach a lower surface of main body section 126, that is, a lower surface 126C of bottom section 126A (refer to FIG. 7).

Tape feeder 81 removes lead component 122 from this tape component 120 and supplies lead component 122 so removed. Since tape feeder 81 can adopt a well-known structure, tape feeder 81 will be described briefly. Tape component 120 is provided in such a manner as to extend in the front-rear direction on an upper surface of tape feeder 81. Tape component 120 is provided in such a state that leads 127, 128 of lead component 122 extend in the Z-direction.

Then, feeder device 132 (refer to FIG. 3) of tape feeder 81 feeds out tape component 120 towards a supply position. Cutting device 134 (refer to FIG. 3) of tape feeder 81 cuts off leads 127, 128 that are taped to carrier tape 124 in the supply position. As a result, tape feeder 81 removes lead component 122 from tape component 120 and supplies lead component 122 so removed.

As described above, tape feeder 81 of the present embodiment cuts two leads 127, 128 to a predetermined length by use of, for example, cutting device 134. This allows leads 127, 128 of lead component 122 so supplied to be cut to the same length. Some lead components 122 are such that the polarity of leads 127, 128 cannot be determined due to a difference in length between leads 127, 128. However, with tape feeder 81 configured to supply lead component 122 with the lengths of leads 127, 128 aligned with each other as described above, the polarity of leads 127, 128 is hardly determined even by comparing the lengths of leads 127, 128 with each other after lead component 122 is supplied. Then, as will be described later, it is effective to determine the polarity of leads 127, 128 based on imaged data of leads 127, 128 and mark portion 130 imaged by use of part camera 28.

Additionally, bulk component supply device 32 is disposed at a longitudinal rear end portion of frame section 40. Bulk component supply device 32 is a device for aligning multiple scattered components and supplying the components in an aligned state. That is, bulk component supply device 32 is a device for aligning multiple arbitrarily postured components and supplying the components in a predetermined posture. Electronic circuit components, solar cell constituent components, power module constituent components, and the like are raised as components that are supplied by component supply device 30 and bulk component supply device 32. Additionally, such electronic circuit components include components with or without leads, and the like.

In component mounting machine 10 of the present embodiment, discard box 15 is provided between conveyance device 50 and component supply device 30 in the Y direction, as shown in FIG. 1. As will be described later, when lead component 122 is discarded based on a polarity determination made on leads 127, 128, work heads 60, 62 move to a position lying over discard box 15 to discard lead component 122 held by suction nozzle 66 into discard box 15.

Figure 3:
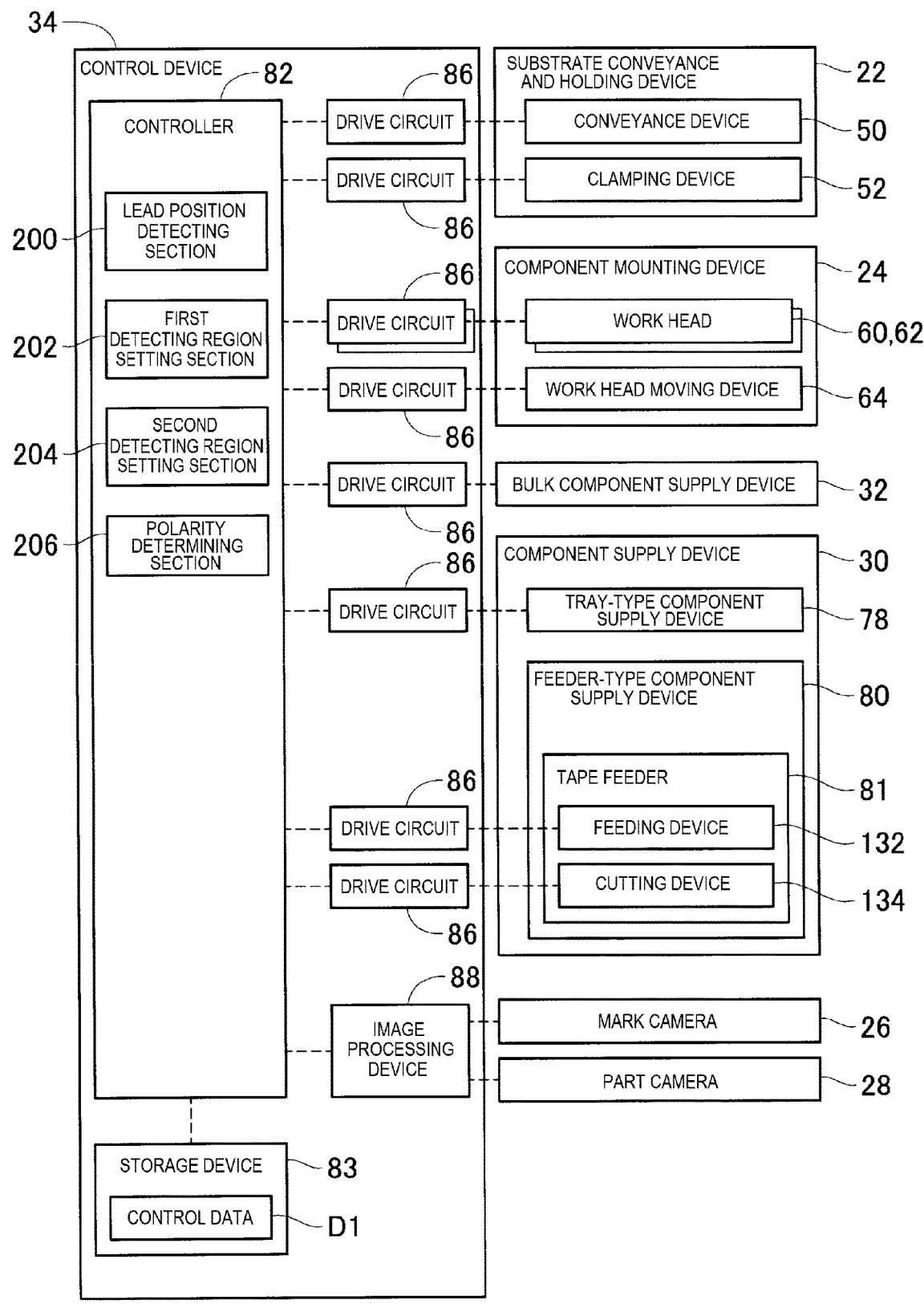
FIG. 3 is a block diagram showing a control device that the component mounting machine includes.

As shown in FIG. 3, control device 34 includes controller 82, storage device 83, multiple drive circuits 86, and image processing device 88. Multiple drive circuits 86 are connected to the constituent devices described above, which include conveyance device 50, clamping device 52, work heads 60, 62, work head moving device 64, tray-type component supply device 78, feeder-type component supply device 80, and bulk component supply device 32. Controller 82 includes CPU, ROM, RAM, and the like, and is mainly configured by a computer, which is connected to multiple drive circuits 86. Controller 82 controls substrate conveyance and holding device 22, component mounting device 24, and the like, and controls operations of component mounting machine 10 in a supervising fashion. In the present embodiment, controller 82 reads control data D1 stored in storage device 83 and executes mounting work of mounting components (lead component 122 and the like) on circuit substrate 12. Storage device 83 includes, for example, a hard disk or memory. Additionally, control data D1 installs data including, for example, a control program for controlling the operations of component mounting machine 10, types of circuit substrates 12 to be produced, types of components to be mounted, mounting positions of components, and the like. In the present embodiment, control data D1 stores data for determining the polarity of lead component 122, for example, a threshold value for determining an average luminance brightness, which will be described later. Further, controller 82 is connected to image processing device 88. Image processing device 88 is configured to process image data obtained by mark camera 26 and part camera 28. Controller 82 acquires various types of information from the image data processed by image processing device 88.

Operations of Component Mounting Machine

With being configured as described above, component mounting machine 10 mounts components on circuit substrate 12 held by substrate conveyance and holding device 22. In the following description, a control performed by controller 82 may be described simply by a device name. For example, a description reading that conveyance device 50 conveys circuit substrate 12 may mean, from time to time that controller 82 executes the control program in control data D1 to cause conveyance device 50 to convey circuit substrate 12.

Specifically speaking, controller 82 causes CPU to execute the control program in control data D1 based on for example, a command from a management computer for managing the production line of circuit substrate 12. Controller 82 controls conveyance device 50 based on execution of the control program. Conveyance device 50 conveys circuit substrate 12 to a work position based on the control by controller 82. Clamping device 52 fixedly holds circuit substrate 12 in the work position.

Next, mark camera 26 moves to a position lying over circuit substrate 12 to image circuit substrate 12. Controller 82 acquires information on a holding position of circuit substrate 12 or the like based on imaged data imaged by mark camera 26. Additionally, component supply device 30 or bulk component supply device 32 supplies a component (lead component 122 or the like) in a predetermined supply position. Then, either of work heads 60, 62 moves to a position lying over the component supply position and holds the component so supplied using suction nozzle 66. Subsequently, the work head, that is, work head 60 or work head 62, holding the component moves to a position lying over part camera 28. Part camera 28 images the component held by suction nozzle 66. Controller 82 acquires information on the component holding position or mark portion 130 (refer to FIG. 4 and the like) based on the imaged data imaged by part camera 28. Controller 82 controls work heads 60, 62 based on the acquired information, such as holding positions of circuit substrate 12 and/or the component. Work heads 60, 62 move to the position lying over circuit substrate 12 while holding the component, and correct the error in the holding position of circuit substrate 12, the error in the holding position of the component, and the like. Then, work heads 60, 62 mount the component on circuit substrate 12 by releasing the component from corresponding suction nozzle 66.

As described above, component mounting machine 10 causes part camera 28 to image the component held by suction nozzle 66 in order to acquire the information on the holding position of the component by suction nozzle 66, mark portion 130, or the like. In the case that a component to be mounted on circuit substrate 12 is lead component 122 (refer to FIG. 4), controller 82 detects positions of distal ends of leads 127, 128 based on the imaged data imaged by part camera 28 in order to allow leads 127, 128 to be inserted into through holes formed in circuit substrate 12.

Figure 5:
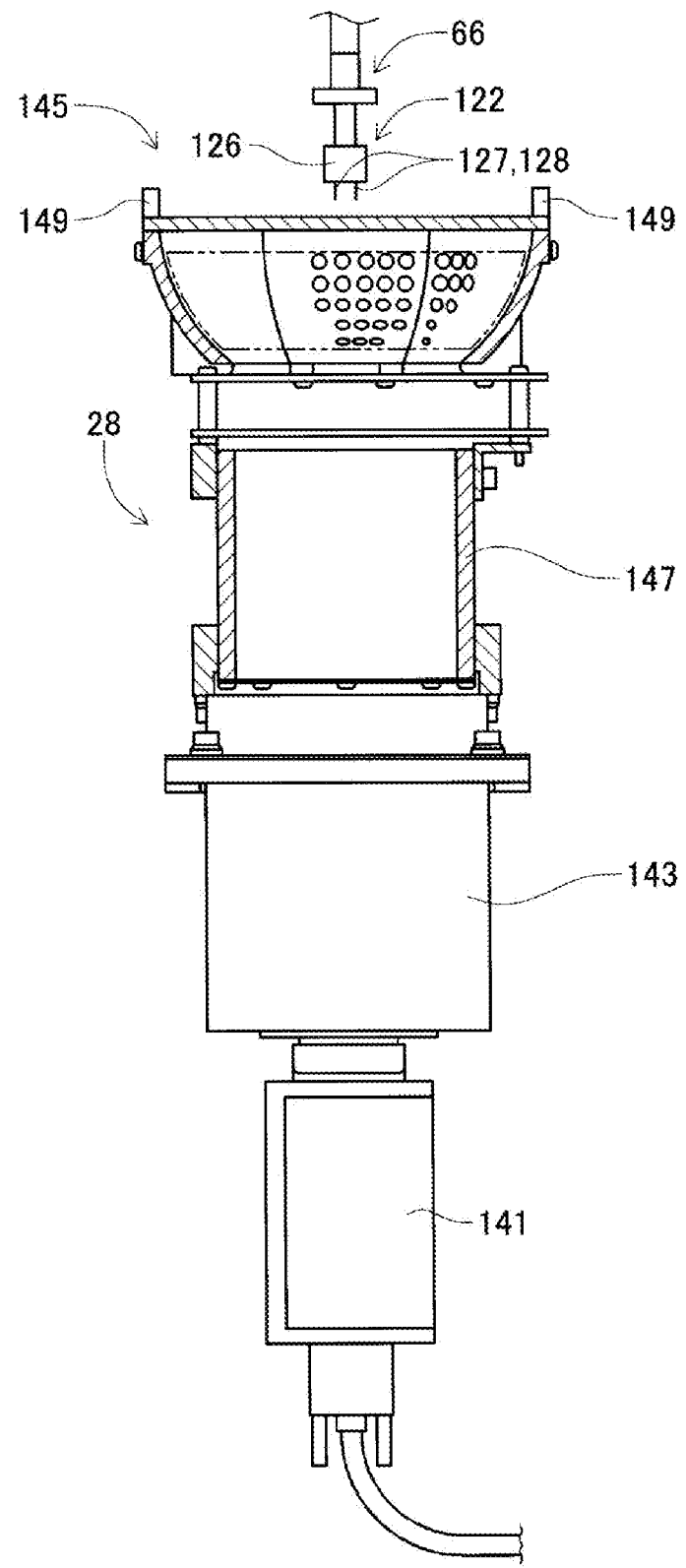
FIG. 5 is a schematic diagram showing a part camera.

To describe this in detail, FIG. 5 shows a state in which lead component 122 picked up by and held to suction nozzle 66 is imaged by part camera 28. As shown in FIG. 5, part camera 28 includes imaging device 141, lens 143, and laser lighting 145. Imaging device 141 has an imaging element (not shown) and is disposed in such a state that a light receiving surface is directed upwards. Lens 143 is fixed to a light receiving surface side, that is, an upper surface side, as seen in FIG. 5, of imaging device 141. Laser lighting 145 is provided above lens 143 via box-shaped member 147 or the like. Laser lighting 145 has four laser irradiation devices 149 (only two laser irradiation devices 149 are shown in FIG. 5). Four laser irradiation devices 149 are disposed in four equally distant positions in such a manner as to surround a central portion of laser lighting 145. Lead component 122, which is held by suction nozzle 66 and constitutes an imaging target, is disposed at the central portion of laser lighting 145. For example, lead component 122 is picked up by and held to suction nozzle 66 at upper surface 126B (refer to FIG. 4) of main body section 126 with leads 127, 128 directed downwards. Then four laser irradiation devices 149 irradiate laser beams from four side locations towards lead component 122 held by suction nozzle 66. Further, since diffusing the laser beam is difficult, each laser irradiation device 149 is configured to irradiate the laser beam towards the respective distal ends of leads 127, 128 of lead component 122 held by suction nozzle 66 with pinpoint accuracy.

Light irradiated from laser irradiation devices 149 is reflected by leads 127, 128 or the like of lead component 122 held by suction nozzle 66, and then enters lens 143 by way of box-shaped member 147. Imaging device 141 detects the light incident on lens 143 by the imaging device. As a result, controller 82 acquires imaged data of lower surface 126C (refer to FIG. 7) and the distal ends of leads 127, 128 of lead component 122 held by suction nozzle 66. Controller 82 detects distal end positions of leads 127, 128 based on the image data imaged by part camera 28. Controller 82 acquires information on a holding position of lead component 122 or the like based on the distal end positions of leads 127, 128 so detected.

Here, as described above, leads 127, 128 of lead component 122 have the polarity. Lead component 122 needs to be mounted on circuit substrate 12 in such a manner as to match the polarity of through holes in circuit substrate 12, that is, the polarity of through holes, wiring patterns, and the like of circuit substrate 12. For example, in the present embodiment, control data D1 has set therein information on the polarity of lead component 122 that is disposed in the supply position of tape feeder 81. As shown in FIG. 4, when tape component 120 is conveyed in conveyance direction 151, in lead component 122 disposed in the supply position, anode lead 128 is disposed frontwards in conveyance direction 151, and cathode lead 127 is disposed rearwards in conveyance direction 151. In this case, control data D1 installs therein information informing that lead 128 (anode) is disposed forwards, while lead 127 (cathode) is disposed rearwards in the supply position.

In the event that lead component 122 is supplied to the supply position with the polarity disposed properly so as to match the information set in advance in the way described above, work heads 60, 62 can pick up lead component 122 whose polarity is disposed according to the information in control data D1. However, there may occur a case in which the polarity disposition of leads 127, 128 of lead component 122 actually supplied from tape feeder 81 (hereinafter, also referred to as an "actual polarity disposition" from time to time) differs from the polarity disposition of leads 127, 128 that is set in advance in control data D1 (hereinafter, also referred to as a "set polarity disposition" from time to time). In such a case, there is a possibility that lead component 122 is mounted on circuit substrate 12 with the polarity disposed wrong.

Specifically speaking, for example, in the case that tape component 120 is stored in a storage box on which polarity is shown, in the event that the storage box is opened in a wrong direction (erroneously from a rear side instead of a front side), tape component 120 is removed from the storage box while the polarity of lead components 122 thereon is disposed reversely to replenish tape feeder 81 therewith. There is a possibility that tape component 120 is supplied from tape feeder 81 with a wrong actual polarity disposition. Additionally, there is a possibility that tape component 120 is wound around a reel of tape feeder 81 with a wrong actual polarity disposition, for example, at a point in time when tape feeder 81 is supplied to a production plant. Alternatively, when tray-type component supply device 78 is replenished with trays, there is a possibility that the operator sets a tray with a wrong polarity disposition in relation to their directions. Further, there is a possibility that bulk component supply device 32 supplies lead component 122 to the supply position with its actual polarity disposition which differs from the set polarity disposition.

To deal properly with these possibilities, component mounting machine 10 needs to determine whether lead component 122 is supplied from component supply device 30 or bulk component supply device 32 to work heads 60, 62 with a proper actual polarity disposition matching the set polarity disposition. Then, in component mounting machine 10 of the present embodiment, part camera 28 captures the images of image mark portions 130 of lead components 122, which are provided with work heads 60, 62 from component supply device 30 or the like, so that determination is made, based on the imaged data imaged by part camera 28, whether the actual polarity disposition coincides with the set polarity disposition.

Figure 6:
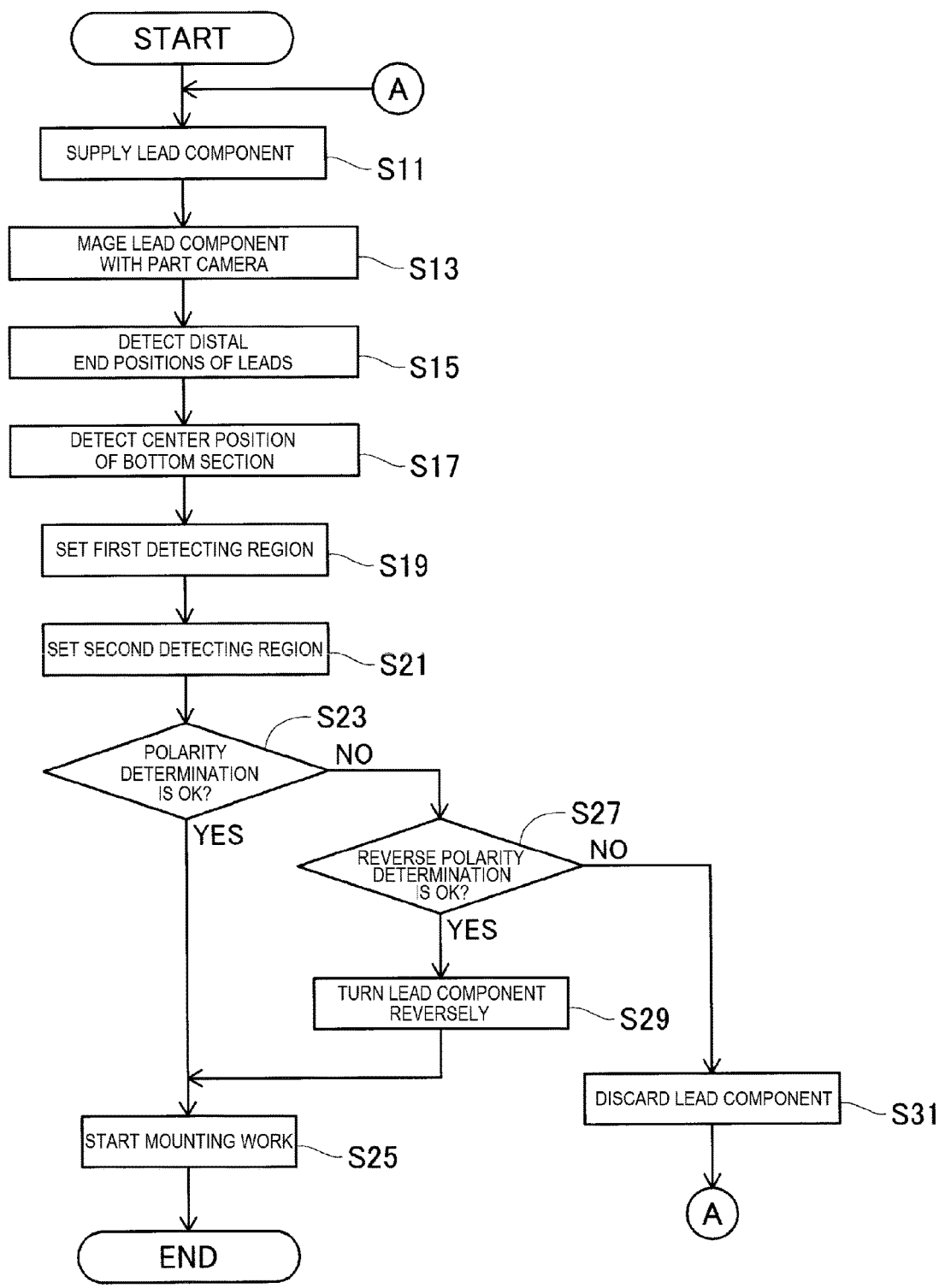
FIG. 6 is a flowchart showing operations of the component mounting machine after a lead component is supplied until the lead component is mounted on a circuit substrate.

FIG. 6 is a flowchart showing operations of component mounting machine 10 that are performed after lead component 122 is supplied until lead component 122 is mounted on circuit substrate 12. For example, controller 82 executes the control program in control data D1 and executes operations shown in FIG. 6 every time one lead component 122 is mounted. Firstly, in step (hereinafter, referred to simply as "S") 11 shown in FIG. 6, controller 82 causes work heads 60, 62 to move to the position lying over the supply position of lead component 122 in component supply device 30 or bulk component supply device 32. Work heads 60, 62 pick up lead component 122 disposed in the supply position in component supply device 30 or the like using suction nozzle 66.

Next, work heads 60, 62 move to the position lying over part camera 28 while holding picked up lead component 122. Part camera 28 images lead component 122 (S13). Next, controller 82 detects distal end positions of leads 127, 128 of lead component 122 based on the imaged data imaged by part camera 28 (S15). Controller 82 detects distal end positions of leads 127, 128 of lead component 122 based on, for example, an luminance brightness of a specific region of the image data.

Figure 7:
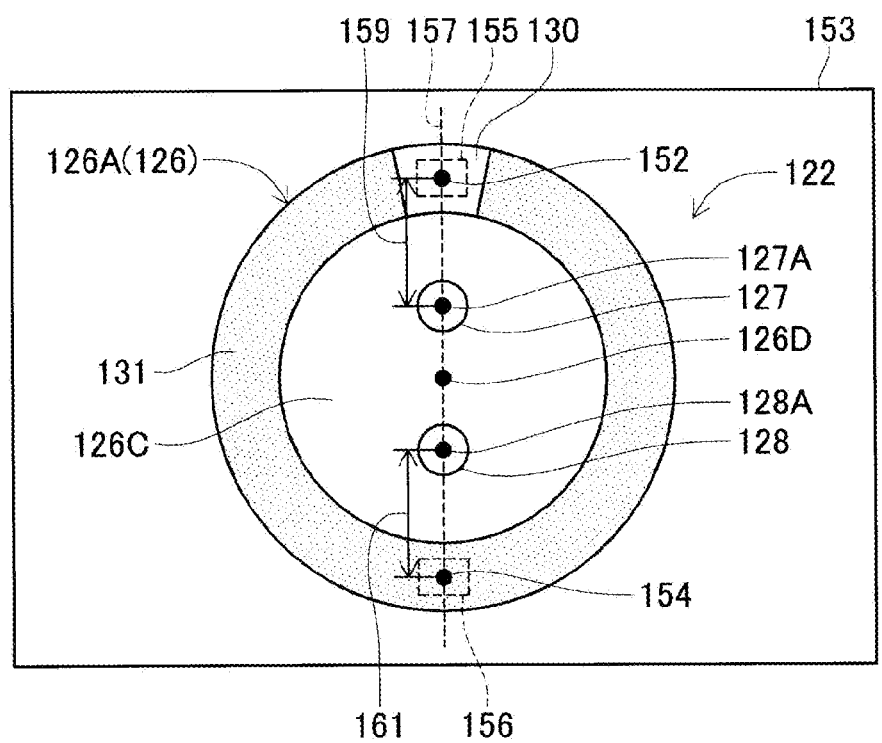
FIG. 7 is a diagram showing imaged data imaged by the part camera.

Specifically speaking, FIG. 7 shows an example of imaged data 153 imaged by part camera 28. Part camera 28 captures, for example, gray-scale or monochrome imaged data 153. Incidentally, part camera 28 may capture color imaged data 153. As shown in FIG. 7, lower surface 126C of main body section 126 (bottom section 126A) of lead component 122 disposed in the imaging position shown in FIG. 5 is imaged at a central portion of imaged data 153. Pair of leads 127, 128 is disposed at a central portion of lower surface 126C. As described above, light irradiated from laser irradiation devices 149 (refer to FIG. 5) is reflected by leads 127, 128 and then enters lens 143. As a result, light reflected at the distal ends of leads 127, 128 is imaged in image data 153. In image data 153, regions corresponding to the distal end positions 127A, 128A of leads 127, 128 tend to have a higher luminance brightness. Then, controller 82 sets a certain region at the central portion of imaged data 153 as a target region, detects locations of a higher luminance brightness within the target region, and determines that positions of the detected locations constitute distal end positions 127A, 128A.

The detection method for detecting distal end positions 127A, 128A of leads 127, 128 is not particularly limited. For example, controller 82 may detect distal end positions 127A, 128A by analyzing a changing pattern of luminance brightness (pixel value) for each of lines of pixels that are aligned vertically and laterally in image data 153. For example, controller 82 may detect, for example, regions where the luminance brightness is increased periodically in a vertical line, a lateral line, and an oblique line in imaged data 153 and determine that positions where the luminance brightness is so increased constitute distal end positions 127A, 128A. Alternatively, controller 82 may detect an edge extending along an outer circumference of lower surface 126C and match in position a collation image stored in advance with the detected edge for determination of distal end positions 127A, 128A.

When detecting two distal end positions from imaged data 153, controller 82 determines that a distal end position lying closer to mark portion 130 constitutes distal end position 127A of lead 127. As described above, control data D1 installs therein information on the polarity of lead component 122 that is disposed in the supply position of tape feeder 81 or the like. Then, controller 82 causes, for example, cathode lead 127 to be disposed at an upper side as seen in FIG. 7. In other words, controller 82 causes lead 127 to be disposed on the premise of the set polarity disposition set in control data D1. As a result, controller 82 can determine based on the two distal end positions detected based on imaged data 153 and the information in control data D1 that for example, the upper distal end position in FIG. 7 constitutes distal end position 127A of cathode lead 127. In addition, controller 82 determines that a distal end position at a lower side as seen in FIG. 7 constitutes distal end position 128A of anode lead 128. However, as described above, there is a possibility that the actual polarity disposition differs from the set polarity disposition due to a human error or the like. Then, controller 82 determines on the position of mark portion 130.

In S15 in FIG. 6, if controller 82 detects distal end positions 127A, 128A, controller 82 detects center position 126D of lower surface 126C of bottom section 126A based on distal end positions 127A, 128A so detected (S17). For example, controller 82 determines, for example, that an intermediate point between distal end positions 127A, 128A, which are detected in S15, constitutes center position 126D. The detection method for detecting center position 126D is not particularly limited. For example, controller 82 may determine center position 126D based on a shape of lower surface 126C of lead component 122. For example, in the case that lower surface 126C has a circular shape, controller 82 may detect an edge of lower surface 126C in imaged data 153 to determine that a center of lower surface 126C constitutes center position 126D.

Next, controller 82 sets first detecting region 155 based on distal end positions 127A, 128A and center position 126D (S19). First detecting region 155 constitutes a region for detecting mark portion 130. For example, controller 82 sets XY coordinates in imaged data 153 based on distal end positions 127A, 128A and center position 126D. As shown in FIG. 7, controller 82 determines straight line 157 that passes through distal end positions 127A, 128A and center position 126D and sets straight line 157 as a Y axis. Additionally, controller 82 sets center position 126D at an origin for the XY coordinates. In addition, controller 82 determines a straight line (not shown) that is at right angles to straight line 157 and which passes through center position 126D as an X axis. Control data D1 stores information on a relationship between distal end positions 127A, 128A and center position 126D of each lead component 122 and the coordinate positions of first detecting region 155, and the like. Controller 82 determines first detecting region 155 based on the information on the coordinate positions in control data D1.

Controller 82 sets a position as region center 152, the position deviating outwards by distance 159 along straight line 157 from, for example, distal end position 127A of lead 127, that is, the distal end position on the negative side and then sets first detecting region 155 forming a rectangular shape around region center 152. Distance 159 is a value set in control data D1 and constitutes, for example, a distance set in advance based on the product information of lead component 122 and denoting a distance between center position 126D and the center of mark portion 130 in design. As a result, in the event that conditions are established that distal end positions 127A, 128A and center position 126D are detected accurately and that the polarity is disposed properly, the result is that mark portion 130 is embraced within first detecting region 155. First detecting region 155 constitutes a region outside pair of leads 127, 128 with including a part of bottom section 126A.

The method for setting the position of first detecting region 155, which is described above, is an example. For example, controller 82 may set first detecting region 155 without detecting center position 126D. Controller 82 sets a position as region center 152, the position deviating outwards by distance 159 along straight line 157 connecting distal end positions 127A, 128A from distal end position 127A. Additionally, first detecting region 155 may be a position deviating from region center 152. The shape of first detecting region 155 is not limited to the rectangular shape and hence may be other polygonal shapes such as a circular shape or an elliptic shape.

Here, as shown in FIG. 7, a lower end portion of mark portion 130 extends to lower surface 126C of main body section 126. For example, main body section 126 is covered with a cover of a predetermined color. Mark portion 130 is provided on this cover, mark portion 130 having a color different from that of the other section of the cover. In the following description, as a matter of convenience of description, the other section than mark portion 130 of the cover of main body section 126 will be referred to as non-mark portion 131. As shown in FIG. 7, mark portion 130 and non-mark portion 131 cover a certain region extending along the outer circumference of lower surface 126C.

Non-mark portion 131 and mark portion 130 have different colors. For example, in the present embodiment, mark portion 130 has a color of a luminance brightness which is higher than that of a color of non-mark portion 131. In this case, in imaged data 153, the luminance brightness of mark portion 130 becomes higher than the luminance brightness of non-mark portion 131. A relationship between the luminance brightness of mark portion 130 and the luminance brightness of non-mark 131 differs depending upon a type of lead component 122 or the like. As a result, there may be a case in which mark portion 130 has a color of a luminance brightness which is lower than that of non-mark 131. In addition, control data D1 stores information regarding the luminance brightness of non-mark portion 131 and mark portion 130.

Controller 82 calculates an average luminance brightness of first detecting region 155 based on a pixel value of first detecting region 155. Controller 82 determines whether an average luminance brightness resulting from the calculation is equal to or larger than a preset threshold. This threshold is a value for determining on an average luminance brightness of mark portion 130 and non-mark portion 131. For example, in the case that the average luminance brightness is equal to or larger than the threshold, controller 82 can detect that mark portion 130 is disposed in first detecting region 155. Incidentally, the method for determining whether mark portion 130 is included in first detecting region 155 is not limited to using the average luminance brightness. For example, controller 82 may determine whether mark portion 130 is included in first detecting region 155 by comparing a highest luminance brightness (pixel value) or a lowest luminance brightness (pixel value) included with first detecting region 155 with the threshold.

Figure 8:
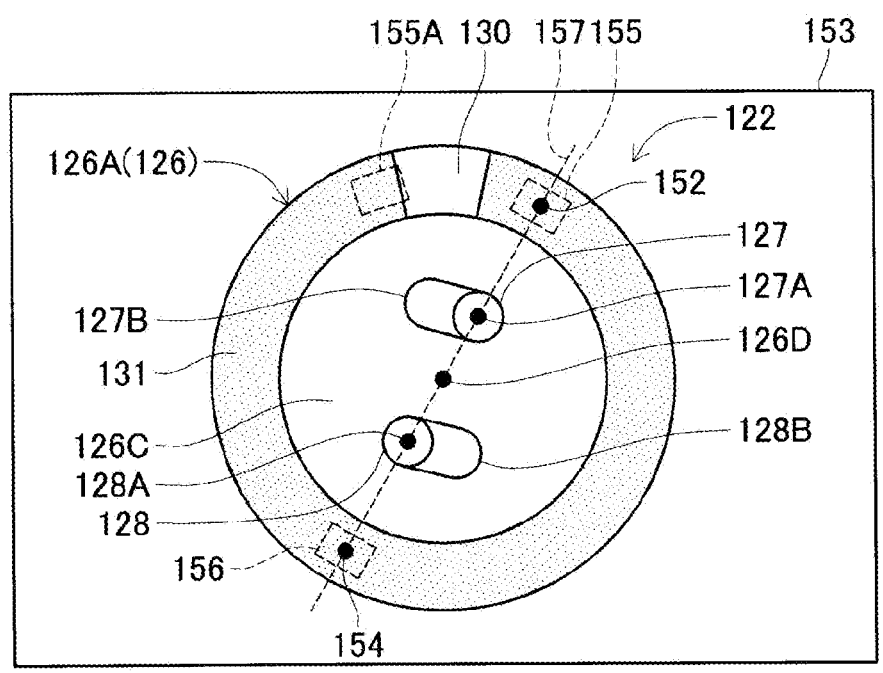
FIG. 8 is a diagram showing imaged data resulting when a lead component, whose leads are bent, is imaged.

In the example shown in FIG. 7, leads 127, 128 extend straight from lower surface 126C. In contrast with this, FIG. 8 shows imaged data 153 resulting from imaging lead component 122 whose leads 127, 128 are bent. Lead 127 shown in FIG. 8 is inclined obliquely from proximal end portion 127B towards a distal end portion (a portion lying closer to distal end position 127A). Similarly, lead 128 is inclined obliquely from a proximal end portion 128B towards a distal end portion (a portion lying closer to distal end position 128A). In this case, distal end positions 127A, 128A take positions deviating from the respective positions shown in FIG. 7 to such an extent that leads 127, 128 are bent. Then, first detecting region 155 deviates from the position shown in FIG. 7 as distal end positions 127A, 128A so deviate. As a result, first detecting region 155 deviates from the position of mark portion 130. First detecting region 155 shown in FIG. 8 does not include mark portion 130 at all. As a result, an average luminance brightness of first detecting region 155 becomes less than the threshold. In addition, also in the case that first detecting region 155A includes partially mark portion 130 in a portion of the region as shown in FIG. 8, there is a possibility that an average luminance brightness becomes less than the threshold. Then, upon determining that the average luminance brightness becomes less than the threshold, controller 82 determines that mark portion 130 exists neither in first detecting region 155 nor in first detecting region 155A.

In view of the situations described above, in the present embodiment, controller 82 sets second detecting region 156 in addition to first detecting region 155. Setting first detecting region 155 in S19 shown in FIG. 6, controller 82 then sets second detecting region 156 (S21). As shown in FIG. 7, controller 82 sets a region outside pair of leads 127, 128 as second detecting region 156 (S21), the region being set at an opposite side to first detecting region 155 across pair of leads 127, 128 with including a part of bottom section 126A. For example, control data D1 stores information regarding a relationship between coordinate positions of second detecting region 156 for each lead component 122. Controller 82 determines second detecting region 156 based on the information on the coordinate positions that control data D1 stores.

Controller 82 sets, for example, a position as region center 154, the position deviating outwards by distance 161 along straight line 157 from distal end position 128A of lead 128. Controller 82 sets second detecting region 156 having a rectangular shape around region center 154. Second detecting region 156 has, for example, the same shape as that of first detecting region 155. Distance 161 is a value set in control data D1 and is, for example, a value set in advance based on the product information of lead component 122. Region center 154 is, for example, a position symmetrical with region center 152 across center position 126D. As a result, in the event that conditions are established that distal end positions 127A, 128A and center position 126D are detected accurately, that the polarity of leads 127, 128 is disposed properly, and that leads 127, 128 are not bent, the result is that mark portion 130 is not included but non-mark portion 131 is included within second detecting region 156.

After setting second detecting region 156 in S21, controller 82 executes S23. As described above, controller 82 can determine whether mark portion 130 exists individually in first detecting region 155 and second detecting region 156 based on the average luminance brightness. Then, controller 82 determines the polarity of lead component 122 based on the average luminance brightness of first detecting region 155 and the average luminance brightness of second detecting region 156 in S23.

Figures 9, 10:
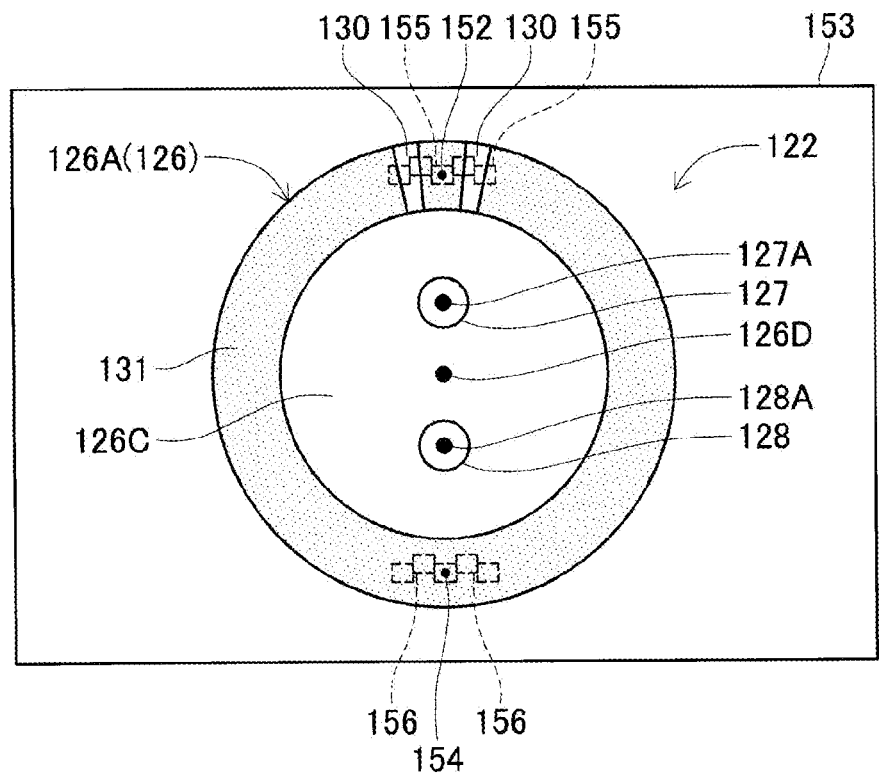
FIG. 9 is a diagram showing imaged data resulting when a component, on which multiple first detecting regions and multiple second detecting regions are set, is imaged.
FIG. 10 is a chart showing a relationship between average luminance brightness of the first detecting region and the second detecting region and results of determinations made on the polarity.

FIG. 10 shows a relationship between the average luminance brightness of first detecting region 155 and second detecting region 156 and results of the polarity determinations. In FIG. 10, "Bright" denotes that the average luminance brightness is equal to or larger than the threshold. "Dark" denotes that the average luminance brightness is less than the threshold. In Case 1 shown in FIG. 10, the average luminance brightness of first detecting region 155 becomes equal to or larger than the threshold, while the average luminance brightness of second detecting region 156 becomes less than the threshold. In this case, mark portion 130 is more likely to be disposed in first detecting region 155 while non-mark portion 131 is disposed in second detecting region 156. In other words, normal state of polarity is more likely to be made such that the actual polarity disposition of lead component 122 coincide with the set polarity disposition that is set in advance.

As a result, upon determining in S23 that the average luminance brightness of first detecting region 155 becomes equal to or larger than the threshold and the average luminance brightness of second detecting region 156 becomes less than the threshold (S23: YES), controller 82 executes mounting work of lead component 122 held by work heads 60, 62 (S25). This allows lead component 122, whose polarity is disposed properly, to be mounted on circuit substrate 12. Controller 82 causes work heads 60, 62 to correct the holding position of lead component 122 based on distal positions 127A, 128A or the like detected from imaged data 153. Work heads 60, 62 mount lead component 122, whose holding position has been so corrected, on circuit substrate 12. Having executed the mounting work of lead component 122 (S25), controller 82 ends the operations shown in FIG. 6. For example, when mounting another lead component 122 subsequently, controller 82 executes the operations starting from S11 in FIG. 6 again.

Consequently, in the present embodiment, upon determining that the average luminance brightness of first detecting region 155 differs from the average luminance brightness of second detecting region 156, controller 82 determines that mark portion 130 exists either in first detecting region 155 or in second detecting region 156. For example, in the event that the luminance brightness of mark portion 130 is higher than the luminance brightness of the other section in imaged data 153, the region including mark portion 130 tends to have a higher average luminance brightness than that of the region that does not include mark portion 130. Then, for example, in the event that the average luminance brightness of first detecting region 155 is the threshold or larger, controller 82 determines that the mark portion exists in first detecting region 155, thereby making it possible to detect the existence of mark portion 130. Incidentally, controller 82 may not compare the average luminance brightness of first detecting region 155 and second detecting region 156 with the threshold. For example, controller 82 may compare the average luminance brightness of first detecting region 155 with the average luminance brightness of second detecting region 156. For example, in the event that the average luminance brightness of first detecting region 155 is higher than the average luminance brightness of second detecting region 156, controller 82 may determine that the mark portion exists in first detecting region 155. Additionally, for example, in the event that the luminance brightness of make section 130 is lower than that of non-mark portion 131, upon determining that the average luminance brightness of first detecting region 155 is higher than the average luminance brightness of second detecting region 156, controller 82 may determine that the mark portion exists in second detecting region 156.

In addition, in the present embodiment, controller 82 detects distal end positions 127A, 128A, which constitute the positions of the respective distal ends of pair of leads 127, 128, based on imaged data 153 (S15). Controller 82 determines center position 126D of lower surface 126C of bottom section 126A based on distal end positions 127A, 128A so detected and then sets first detecting region 155 based on distal end positions 127A, 128A and center position 126D (S19).

When setting first detecting region 155 based on distal end positions 127A, 128A of leads 127, 128, in the event that leads 127, 128 are bent relative to main body section 126 as described above, there is a possibility that the position of first detecting region 155 deviates with respect to mark portion 130. As a result, the detection accuracy of mark portion 130 is reduced. For this reason, in the configuration in which mark portion 130 is detected based on distal end positions 127A, 128A, it becomes extremely effective to determine not only the existence of mark portion 130 but also the polarity of leads 127, 128 by confirming not only first detecting region 155 but also second detecting region 156.

On the other hand, if the average luminance brightness of first detecting region 155 is not equal to or larger than the threshold, that is, if the average luminance brightness is less than the threshold (S23: NO), controller 82 executes S27. Additionally, in the event that the average luminance brightness of second detecting region 156 is not less than the threshold, that is, is equal to or larger than the threshold (S23: NO), controller 82 executes S27. In S27, controller 82 determines whether the polarity of lead component 122 is reverse polarity.

In Case 2 shown in FIG. 10, the average luminance brightness of first detecting region 155 is less than the threshold, while the average luminance brightness of second detecting region 156 is the threshold or larger. In this case, there is a high possibility that non-mark portion 131 is disposed in first detecting region 155, while mark portion 130 is disposed in the second detecting region 156. That is, there is a high possibility that the actual polarity disposition and the set polarity disposition of the lead component 122 is reversed.

To cope with this, upon determining in S27 that the average luminance brightness of first detecting region 155 is less than threshold and the average luminance brightness of second detecting region 156 is threshold or larger (S27: YES), controller 82 causes lead component 122 held by work heads 60, 62 to be reversed (S29). For example, work heads 60, 62 rotate suction nozzles 66 about corresponding rotational axes extending along axial directions (the Z direction) through 180 degrees. Leads 127, 128 exchange their positions. That is, the polarity of lead component 122 is corrected from the reverse polarity to normal ones. After reversing lead component 122 in S29, controller 82 executes mounting work of reversed lead component 122 (S25) and ends the operations shown in FIG. 6.

Consequently, in the present embodiment, upon determining that the polarity resulting from the determination is reversed to the polarity set in advance (for example, the set polarity disposition), controller 82 causes work heads 60, 62 to rotate reversely main body section 126 so that pair of leads 127, 128 exchange their current positions. According to this configuration, in the event that the determined polarity dispositions is reversed to the desired polarity dispositions, controller 82 can correct the actual polarity dispositions of leads 127, 128 to the desired set polarity dispositions by rotating reversely main body section 126.

On the other hand, upon determining in S27 that the average luminance brightness of first detecting region 155 is less than the threshold while the average luminance brightness of second detecting region 156 is not equal to or larger than the threshold (S27: NO), controller 82 executes S31. In this case, lead component 122 results in Case 3 or Case 4 shown in FIG. 10. In Case 3, the average luminance brightness of first detecting region 155 and second detecting region 156 are less than the threshold. In this case, there is a high possibility that non-mark portion 131 is disposed in both first detecting region 155 and second detecting region 156. In addition, in Case 4, the average luminance brightness of first detecting region 155 and second detecting region 156 are equal to or larger than the threshold. In this case, the average luminance brightness of both first detecting region 155 and second detecting region 156 are increased for some reason. In Cases 3, 4, an abnormal state is occurring in which the polarity determination based on the position of mark portion 130 is hardly performed.

As a result, in S31, controller 82 causes lead component 122 held by work heads 60, 62 to be discarded into discard box 15 (refer to FIG. 1). Work heads 60, 62 move to a position lying over discard box 15 to discard lead component 122 held by suction nozzle 66 into discard box 15. Controller 82 restarts the operations starting from S11 and causes the component supply device to execute supply work of lead component 122. Controller 82 may causes tape feeder 81, which differs from tape feeder 81 used previously, to supply lead component 122 of the same type in S11 after controller 82 has executed S31. As a result, in the event that tape feeder 81 used for the previous supply work comes to have a problem, lead component 122 is supplied from different tape feeder 81, whereby lead component 122 of a normal polarity disposition can be supplied.

Additionally, controller 82 may issue information informing that an error occurs in the disposition of the polarity of lead component 122 in S31. For example, controller 82 may display the occurrence of abnormality on a display screen of display device 17 (refer to FIG. 1) of component mounting machine 10 or a management computer (not shown) for managing component mounting machine 10. Further, controller 82 may display the mounting position (the slot number) of tape feeder 81 that has supplied lead component 122 or the like as error information. As a result, the operator can confirm the contents of the display and act properly, for example, to confirm the state of tape feeder 81 in which the error occurs. In this manner, according to the present embodiment, controller 82 can determine on the polarity of lead component 122 based on first detecting region 155 and second detecting region 156 to enable component mounting machine 10 to execute the mounting work properly. In addition, controller 82 may execute both the discard of lead component 122 into discard box 15 and the issuance of information informing of the error in S31.

Consequently, according to the present embodiment, upon determining that mark portion 130 exists neither in first detecting region 155 nor in second detecting region 156, controller 82 executes at least one of the discarding operation of lead component 122 and the error informing operation. According to this configuration, in the event that mark portion 130 exists neither in first detecting region 155 nor in second detecting region 156, controller 82 can perform proper actions such as causing work heads 60, 62 to discard erroneous lead component 122 and supplying another lead component 122 to work heads 60, 62 for pickup. In addition, by informing the operator of the error, controller 82 can prompt the operator to take a proper action such as confirming the state of lead component 122 inside component mounting machine 10.

Setting of Multiple First Detecting Regions and Multiple Second Detecting Regions Additionally, the shape of first detecting region 155 or the number of first detecting regions 155 may be changed as required in accordance with the shape of mark portion 130 or the number of mark portions 130. In the example shown in FIG. 7, controller 82 sets one first detecting region 155 and one second detecting region 156; however, controller 82 may set multiple first detecting regions 155 and multiple second detecting regions 156. FIG. 9 shows imaged data 153 in which multiple first detecting regions 155 and multiple second detecting regions 156 are set.

In lead component 122 shown in FIG. 9, mark portion 130 is smaller in size than in lead component 122 shown in FIG. 7, and multiple mark portions 130 are provided. In this way, the shape, size, number, and the like of mark portion 130 differ in accordance with types of lead components 122.

Here, for example, in the case that first detecting region 155 is set which is larger in size than mark portion 130, first detecting region 155 comes to include partially non-mark portion 131 in addition to mark portion 130. The average luminance brightness of first detecting region 155 decreases as the ratio at which first detecting region 155 includes non-mark portion 131 increases. With first detecting region 155 decreased to the size of mark portion 130, when the position of first detecting region 155 deviates with respect to mark portion 130 as leads 127, 128 are bent as described above, there is a high possibility that mark portion 130 is not included in first detecting region 155.

Then, controller 82 sets multiple first detecting regions 155 and second detecting regions 156 and determines an average luminance brightness of each of first detecting regions 155, thereby making it possible to increase the detection accuracy of mark portion 130. In S19 in FIG. 6, for example, as shown in FIG. 9, controller 82 sets first detecting regions 155 around region center 152. This region center 152 is a position indicting an intermediate point between two mark portions 30 aligned in a circumferential direction of lower surface 126C shown in FIG. 9. Controller 82 sets region center 152 based on distal end positions 127A, 128A, center position 126D, and the information in control data D1. First detecting region 155 is a region smaller in size than first detecting region 155 shown in FIG. 7, and the size of first detecting region 155 is reduced to match the size of mark portion 130. For example, a width of first detecting region 155 in a circumferential direction of lower surface 126C is equal to or smaller than a width of mark portion 130 in the circumferential direction. With first detecting region 155 sized in the way described above, first detecting region 155 comes to fall within mark portion 130. Then, when first detecting region 155 is disposed within mark portion 130, the average luminance brightness of first detecting region 155 can be increased to the threshold or higher in a more ensured fashion. In addition, controller 82 sets multiple first detecting regions 155 which are aligned adjacent to each other with first detecting region 155 including region center 152 interposed therebetween. In the example shown in FIG. 9, four adjacent first detecting regions 155 each have the same shape as that of first detecting region 155 including region center 152. Four adjacent first detecting regions 155 are individually disposed in positions which deviate in the circumferential direction of lower surface 126C with first detecting region 155 including region center 152 disposed centrally. Four adjacent first detecting regions 155 are individually disposed in positions which deviate in a radial direction of lower surface 126C in a staggered fashion with respect to central first detecting region 155.

Similarly, in S21 of FIG. 6, controller 82 sets a relatively small second detecting region 156 around region center 154. Region center 154 is, for example, a position symmetrical with region center 152 across center position 126D. Controller 82 sets multiple second detecting regions 156 which are aligned adjacent to each other with second detecting region 156 including region center 154 interposed therebetween. In the example shown in FIG. 9, four adjacent second detecting regions 156 are individually disposed in positions which deviate in the circumferential direction of lower surface 126C with second detecting region 156 including region center 154 disposed centrally. Four adjacent second detecting regions 156 are individually disposed in positions which deviate in the radial direction of lower surface 126C in a staggered fashion with respect to central second detecting region 156. The shapes, numbers, positions, and the like of multiple first detecting regions 155 and multiple second detecting regions 156 shown in FIG. 9 represent examples thereof and are changed as required in accordance with the structures and the like of lead components 122.

In S23 in FIG. 6, controller 82 determines whether mark portion 130 exists in each of multiple first detecting regions 155 and multiple second detecting regions 156. Thus, in the present embodiment, controller 82 sets multiple first detecting regions 155 which are positioned differently from one another and multiple second detecting regions 156 which are positioned differently from one another. Then, controller 82 determines the polarity of pair of leads 127, 128 based on whether mark portion 130 exists in each of multiple first detecting regions 155 and multiple second detecting regions 156. According to this configuration, mark portion 130 can be detected with good accuracy by determining the existence of mark portion 130 of various sizes and shapes for the multiple detecting regions.

Then, upon determining in S23, for example, that the average luminance brightness of at least one first detecting region 155 in five first detecting regions 155 is equal to or larger than the threshold (the example of the predetermined luminance brightness value of the present disclosure) and that the average luminance brightness of all five second detecting regions 156 are less than the threshold (S23: YES), controller 82 causes component mounting machine 10 to execute the mounting work (S25). Thus, in the event that at least one first detecting region 155 in multiple first detecting regions 155 includes mark portion 130, controller 82 detects mark portion 130 in first detecting region 155 in question to thereby cause component mounting machine 10 to execute the mounting work. Consequently, multiple small first detecting regions 155 are set for lead component 122 having small mark portion 130 so as to detect mark portion 130 with good accuracy, thereby making it possible to determine the polarity of lead component 122 with good accuracy, whereby proper work can be executed. On the other hand, for example, if all the average luminance brightness of five first detecting regions 155 are not equal to or larger than the threshold, that is, are less than the threshold (S23: NO), controller 82 may execute S27. In addition, if the average luminance brightness of at least one second detecting region 156 in five second detecting regions 156 is equal to or larger than the threshold (S23: NO), controller 82 may execute S27.

In the event that mark portion 130 exists in any of multiple first detecting regions 155, the average luminance brightness of first detecting region 155 including mark portion 130 becomes higher than the average luminance brightness of remaining first detecting regions 155 including no mark portion 130. Then, upon determining that in multiple first determining regions 155, there exists even one first detecting region 155 having an average luminance brightness which is equal to or larger than the threshold and that no mark portion 130 exists in all second detecting region 156, controller 82 can detect that mark portion 130 exists in any one of multiple first detecting regions 155. Upon determining that the average luminance brightness of at least one first detecting region 155 is equal to or larger than the threshold, controller 82 may not execute S25. For example, if, in five first detecting regions 155 shown in FIG. 9, more than a half, that is, three first detecting regions 155 have an average luminance brightness which is equal to or larger than the threshold (S23: YES), controller 82 may execute S25.

In addition, upon determining in S27, for example, that the average luminance brightness of all five first detecting regions 155 are less than the threshold and that in five second detecting regions 156, the average luminance brightness of at least one second detecting region 156 is equal to or larger than the threshold (S27: YES), controller 82 may cause lead component 122 held by work heads 60, 62 to be rotated reversely (S29). This enables lead component 122 of reverse polarity to be corrected to have normal polarity for mounting. Further, in the event that the average luminance brightness of all first and second detecting regions 155, 156 are equal to or larger than the threshold or that the average luminance brightness of all first and second detecting regions 155, 156 are less than the threshold, controller 82 may execute S31. This enables lead component 122 whose mark portion 130 cannot be detected properly to be discarded.

Setting of Only Multiple First Detecting Regions 155

Figure 11:
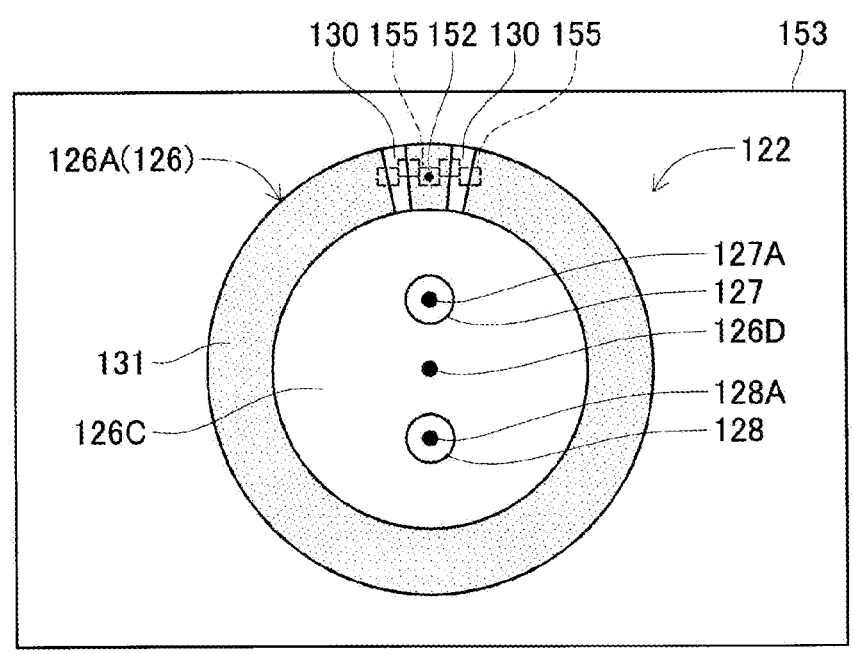
FIG. 11 is a diagram showing image data resulting when a component, on which only multiple first detection regions are set, is imaged.

Additionally, controller 82 may determine the polarity using only multiple first detecting regions 155 without setting any second detecting region 156. FIG. 11 shows imaged data 153 resulting when only multiple first detecting regions 155 are set. In this case, upon determining in, for example, S23 in FIG. 6 that the average luminance brightness of at least one first determining region 155 in multiple first detecting regions 155 is equal to or larger than the threshold (the example of the predetermined luminance brightness value in the present disclosure) (S23: YES), controller 82 may executes S25. As a result, upon determining that in multiple first detecting regions 155, there exist even one first detecting region 155 having an average luminance brightness which is equal to or larger than the threshold, controller 82 can determine that mark portion 130 exists in any one of multiple first detecting regions 155.

Thus, the present embodiment, which has been described heretofore, provides the following effects. In the present embodiment, controller 82 detects distal end positions 127A, 128A of leads 127, 128 based on imaged data 153 imaged by part camera 28 (S15 in FIG. 6) and sets first detecting regions 155 and second detecting regions 156 based on distal end positions 127A, 128B (S19, S21). First detecting regions 155 and second detecting regions 156 are positioned outside pair of leads 127, 128 with respectively including a part of lower surface 126C of bottom section 126A. Additionally, first detecting regions 155 and second detecting regions 156 constitute regions which are disposed with pair of leads 127, 128 interposed therebetween. Then, controller 82 determines the polarity of leads 127, 128 based on whether mark portion 130 exists in each of first detecting regions 155 and second detecting regions 156 (S23).

Here, in the case that leads 127, 128 are bent, the positional relationship between mark portion 130 and leads 127, 128 is changed according to the degree at which leads 127, 128 are bent (refer to FIGS. 7 and 8). On the other hand, in general, mark portion 130 is provided on a negative side, that is, on an outer side of one lead 127 of pair of leads 127, 128. As a result, a portion on the outer side of one lead 127 where mark portion 130 is provided and non-mark portion 131 on an outer side of other lead 128 where no mark portion 130 is provided come to have different luminance brightness values. Then, controller 82 determines whether mark portion 130 exists based on the average luminance brightness of the two detecting regions, that is, first detecting regions 155 and second detecting regions 156 which are disposed to face each other with pair of leads 127, 128 interposed therebetween. As a result, for example, controller 82 can confirm not only that mark portion 130 in the detecting regions on one side but also that no mark portion 130 exists in the detecting regions on the other side. As a result, controller 82 can detect the polarity of leads 127, 128 based on the position of mark portion 130 with good accuracy. Controller 82 has, as shown in FIG. 3, lead position detecting section 200, first detecting region setting section 202, second detecting region setting section 204, and polarity determining section 206. Lead position detecting section 200 and the like are processing modules which are realized by executing the control program in control data D1 by CPU of controller 82. Lead position detecting section 200 and the like may be configured not by software such as the processing modules but by hardware such as processing circuits. Lead position detecting section 200 and the like may be configured by a combination of software and hardware. Lead position detecting section 200 is a functional section for detecting distal end positions 127A, 128A of leads 127, 128 based on imaged data 153 imaged by part camera 28. First detecting region setting section 202 is a functional section for setting first detecting regions 155 based on distal end positions 127A, 128A detected by lead position detecting section 200. Second detecting region setting section 204 is a functional section for setting second detecting regions 156. Polarity determining section 206 is a functional section for determining the polarity of leads 127, 128 based on whether mark portion 130 exists in each of first detecting regions 155 and second detecting regions 156.

Incidentally, component mounting machine 10 is an example of a work machine. Part camera 28 is an example of an imaging device. Control device 34 and controller 82 are an example of a control device. Work heads 60, 62 are an example of a head section. Lead component 122 is an example of a lead component. Main body section 126 is an example of a main body section. Bottom section 126A is an example of a bottom section. Leads 127 and 128 are an example of a pair of leads. Distal end positions 127A, 128A are an example of a distal end position and a lead position. Mark portion 130 is an example of a mark portion. The step executed by lead position detecting section 200 is an example of a lead position detecting step. The step executed by first detecting region setting section 202 is an example of a first detecting region setting step. The step executed by second detecting region setting section 204 is an example of a second detecting region setting step. The step executed by polarity determining section 206 is an example of a polarity determining step.

The present disclosure is not limited to the embodiment that has been described heretofore and hence can be carried out in various forms in which various modifications and improvements are made based on the knowledge of those skilled in the art to which the present disclosure pertains. For example, the device for holding lead component 122 is not limited to suction nozzle 66. For example, work heads 60, 62 may include a chuck for clamping main body section 126 of lead component 122. In addition, controller 82 is described as detecting distal end positions 127A, 128A as the positions of leads 127, 128; however, the present disclosure is not limited thereto. For example, controller 82 may detect proximal end portions 127B, 128B of leads 127, 128 and set first detecting regions 155 based on proximal end portions 127B, 128B. Further, lead component 122 may be configured so that mark portion 130 is provided on the positive side. Furthermore, mark portion 130 may be a symbol, a character, or a figure having a luminance brightness which differs from that of non-mark portion 131. The predetermined threshold of the present disclosure may be not only a range equal to or larger than an arbitrary threshold or a range less than the arbitrary threshold but also a range extending from an arbitrary threshold to another threshold.

In the embodiment that has been described heretofore, while component mounting machine 10 is adopted as the work machine of the subject patent application, the present disclosure is not limited thereto. For example, the work machine may be bulk component supply device 32 for supplying components. Bulk component supply device 32 aligns multiple lead components 122 scattered loosely and supplies lead components 122 so aligned. For example, in the case that bulk component supply device 32 includes a work head configured to pick up lead components 122 scattered loosely, bulk component supply device 32 may image lead component 122 picked up by the work head. Additionally, bulk component supply device 32 may set first detecting regions 155 and second detecting regions 156 in imaged data 153 and determine the polarity based on mark portion 130. Then, bulk component supply device 32 may align lead component 122 into a predetermined posture for supply when the actual polarity disposition coincides with the set polarity disposition. Further, bulk component supply device 32 may rotate reversely lead component 122 for supply when the actual polarity disposition and the set polarity disposition is reversed. Furthermore, bulk component supply device 32 may discard lead component 122 when mark portion 130 cannot be detected properly. Consequently, the work machine of the present disclosure can be applied not only to component mounting machine 10 but also to various types of work machines such as bulk component supply device 32 which is required to determine the polarity of lead component 122, and when so applied, the same working effects as those provided when applied to component mounting machine 10 can be obtained.

REFERENCE SIGNS LIST

10 Component mounting machine (Work machine), 28 Part camera (Imaging device), 34 Control device, 60, 62 Work head (Head section), 82 Controller (Control device), 122 Lead component, 126 Main body section, 126A Bottom section, 127,128 Lead, 127A, 128A Distal end position (Lead position), 130 Mark portion, 200 Lead position detecting section, 202 First detecting region setting section, 204 Second detecting region setting section, 206 Polarity determining section.

The invention claimed is:

1. A work machine comprising:
    a head section configured to hold and move a lead component with having a main body section, a pair of leads provided at a bottom section of the main body section, and a mark portion indicating a polarity of the pair of leads;
    an imaging device configured to image the bottom section of the lead component held by the head section; and
    a control device, the control device comprises:
    a lead position detecting section configured to detect, based on imaged data imaged by the imaging device, a lead position which is positions of the pair of leads;
    a first detecting region setting section configured to set, based on the lead position detected by the lead position detecting section, a first detecting region constituting a region outside the pair of leads with including a part of the bottom section;
    a second detecting region setting section configured to set a second detecting region constituting a region outside the pair of leads, being opposed to the first detecting region across the pair of leads, with including a part of the bottom section; and
    a polarity determining section configured to determine the polarity of the pair of leads based on whether the mark portion exists in each of the first detecting region and the second detecting region.

2. The work machine according to claim 1,
    wherein the first detecting region setting section sets multiple first detecting regions, the first detecting regions being disposed in different positions from each other,
    wherein the second detecting region setting section sets multiple second detecting regions, the second detecting regions being disposed in different positions from each other, and
    wherein the polarity determining section determines the polarity of the pair leads based on whether the mark portion exists in each of the multiple first detecting regions and the multiple second detecting regions.

3. The work machine according to claim 2, wherein upon determination being made such that an average luminance brightness of at least one first detecting region of the multiple first detecting regions is corresponding to a predetermined luminance brightness value, the polarity determining section determines that the mark portion exists in the at least one first detecting.

4. The work machine according to claim 1, wherein upon determination being made such that an average luminance brightness of the first detecting region differs from an average luminance brightness of the second detecting region, the polarity determining section determines that the mark portion exists in the first detecting region or the second detecting region.

5. The work machine according to claim 1,
wherein the lead position detecting section detects distal end positions which are positions of respective distal ends of the pair of leads as the lead position based on the imaged data, and
wherein the first detecting region setting section determines a center position of the bottom section based on the distal end positions detected by the lead position detecting section, and sets the first detecting region based on the distal end positions and the center position.

6. The work machine according to claim 1, wherein upon determination being made such that the polarity resulting from the determination is reversed to the polarity set in advance, the polarity determining section causes the head section to rotate reversely the main body section so that positions of the pair of leads are exchanged.

7. The work machine according to claim 1, wherein upon determination being made such that the mark portion exists neither in the first detecting region nor in the second detecting region, the polarity determining section executes at least one of processes among a process of discarding the lead component and a process of informing of an error.

8. A method for determining polarity for a work machine comprising a head section configured to hold and move a lead component with having a main body section, a pair of leads provided at a bottom section of the main body section, and a mark portion indicating polarity of the pair of leads, and an imaging device configured to image the bottom section of the lead component held by the head section; the method for determining polarity being configured to determine the polarity of the pair of leads, the method comprising;
a lead position detecting step of detecting, based on imaged data imaged by the imaging device, a lead position which is positions of the pair of leads;
a first detecting region setting step of setting, based on the lead position detected by the lead position detecting step, a first detecting region constituting a region outside the pair of leads with including a part of the bottom section;
a second detecting region setting step of setting a second detecting region constituting a region outside the pair of leads, being opposed to the first detecting region across the pair of leads with including a portion of the bottom section outside the pair of leads; and
a polarity determining step of determining the polarity of the pair of leads based on whether the mark portion exists in each of the first detecting region and the second detecting region.

* * * * *